United States Patent
Hsu et al.

(10) Patent No.: US 12,080,567 B2
(45) Date of Patent: Sep. 3, 2024

(54) SYSTEMS AND METHODS FOR IN-SITU MARANGONI CLEANING

(71) Applicant: Taiwan Semiconductor Manufacturing Co., Ltd., Hsinchu (TW)

(72) Inventors: Wei-Chun Hsu, Hsin-Chu (TW); Shu-Yen Wang, Hsin-Chu (TW); Chui-Ya Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/874,103

(22) Filed: Jul. 26, 2022

(65) Prior Publication Data

US 2022/0359237 A1   Nov. 10, 2022

Related U.S. Application Data

(62) Division of application No. 16/547,428, filed on Aug. 21, 2019.

(60) Provisional application No. 62/724,848, filed on Aug. 30, 2018.

(51) Int. Cl.
*H01L 21/67* (2006.01)
*H01L 21/02* (2006.01)

(52) U.S. Cl.
CPC .. *H01L 21/67057* (2013.01); *H01L 21/02057* (2013.01); *H01L 21/67034* (2013.01); *H01L 21/67248* (2013.01); *H01L 21/67253* (2013.01)

(58) Field of Classification Search
CPC ......... H01L 21/02057; H01L 21/67034; H01L 21/67057; H01L 21/67253
See application file for complete search history.

(56) References Cited

U.S. PATENT DOCUMENTS

| | | |
|---|---|---|
| 6,625,901 B1 | 9/2003 | Mehmandoust |
| 2003/0106239 A1 | 6/2003 | Yi |
| 2004/0194806 A1 | 10/2004 | Yang |
| 2005/0091874 A1 | 5/2005 | Chen |
| 2006/0005422 A1 | 1/2006 | Yi |
| 2007/0157947 A1 | 7/2007 | Kim |
| 2009/0084405 A1* | 4/2009 | Kimura ............. H01L 21/67028 134/18 |
| 2011/0220153 A1 | 9/2011 | Tanaka |

* cited by examiner

*Primary Examiner* — Marc Lorenzi
(74) *Attorney, Agent, or Firm* — Duane Morris LLP

(57) ABSTRACT

In an embodiment, a method includes: immersing a wafer in a bath within a cleaning chamber; removing the wafer out of the bath through a solvent and into a gas within the cleaning chamber; determining a parameter value from the gas; and performing remediation within the cleaning chamber in response to determining that the parameter value is beyond a threshold value.

20 Claims, 7 Drawing Sheets

SYSTEMS AND METHODS FOR IN-SITU MARANGONI CLEANING

CROSS REFERENCE TO RELATED APPLICATIONS

This application is a division of U.S. patent application Ser. No. 16/547,428, filed Aug. 21, 2019, which claims priority to U.S. provisional patent application Ser. No. 62/724,848 filed on Aug. 30, 2018, each of which are incorporated by reference herein in their entireties.

BACKGROUND

With advances of electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed requirements, dimensions of semiconductor integrated circuits have been reduced and various materials and techniques have been proposed to achieve these requirements and overcome obstacles during manufacturing. Controlling the conditions of processing wafers within chambers or tanks is an important part of semiconductor fabrication technology.

One of the important concerns of semiconductor fabrication technology is contamination due to the formation or presence of undesirable particles during manufacturing of integrated circuits. Typically, particles are removed by creating a downflow or an upflow within a bath. However, upon removal of the wafer from the bath, the liquid would evaporate from the wafer's surface causing streaking, spotting and/or leaving bath residue on the surface of the wafer. Such streaking, spotting and residue can cause subsequent device failure. A method known as Marangoni drying creates a surface tension gradient to induce liquid to flow from the wafer in a manner that reduces liquid on the wafer, and thus avoids streaking, spotting, and residue marks. After removal of the liquid using Marangoni drying, the wafer is then further processed. Operators or engineers may manually adjust the flow rate or pressure of the liquid within the bath and the Marangoni drying process within desired specifications. However, particles may still deposit on surfaces of wafers and result in contamination despite the presence of a flow within a bath and use of the Marangoni drying technique. Accordingly, conventional techniques to avoid particle contamination may require large amounts of overhead and expensive hardware, but still fail to produce satisfactory results. Therefore, conventional techniques to avoid contamination are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
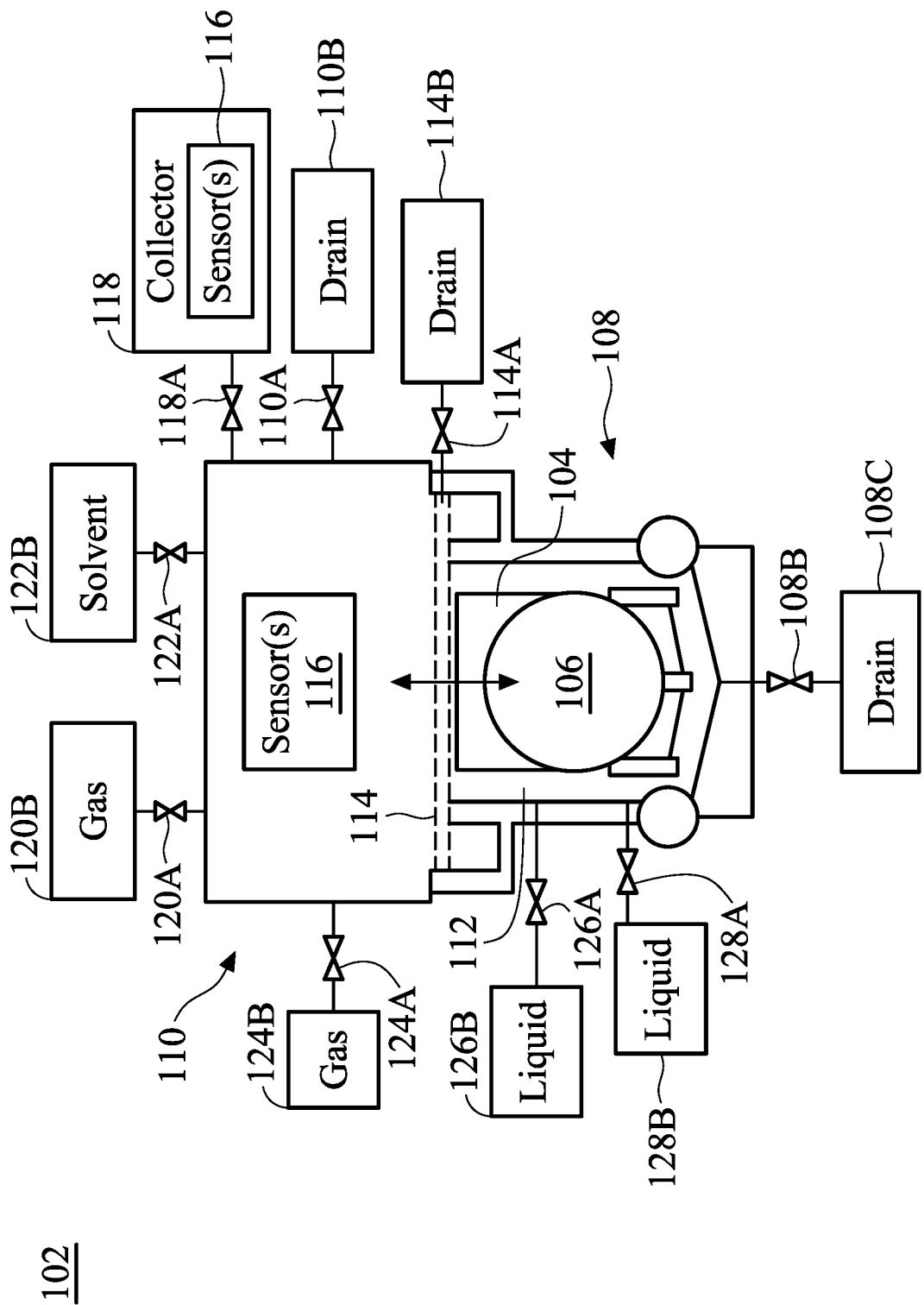
FIG. 1 is a block diagram of a Marangoni cleaning system, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The Marangoni effect describes mass transfer along an interface between two liquids due to a gradient of surface tension between the two liquids. A liquid with a high surface tension pulls more strongly on surrounding liquid than a liquid with a low surface tension. Therefore, a gradient in surface tension on a liquid will cause the liquid to flow away from regions of low surface tension.

Marangoni drying creates a surface tension gradient to induce liquid to flow from a wafer in a manner that leaves the wafer virtually free of the liquid, and thus may avoid streaking, spotting, and residue marks on the wafer. During Marangoni drying within a cleaning chamber, a solvent miscible with the liquid (e.g., isopropyl alcohol (IPA)) is introduced to a liquid meniscus, which forms as the wafer is lifted from the bath or as the liquid is drained from the wafer. The solvent may be absorbed along the surface of the liquid such that the concentration of the absorbed solvent is higher at the tip of the meniscus. The higher concentration of absorbed solvent causes surface tension to be lower at the tip of the meniscus than in the bulk of the liquid. This causes the liquid to flow from the drying meniscus toward rest of the liquid. Such a flow may be termed as a Marangoni flow and can be employed to achieve wafer drying without leaving streaks, spotting, or bath residue on the wafer. After application of the Marangoni flow, the wafer may be further dried through the application of a drying gas (e.g., $N_2$ or filtered ambient air) to the wafer within a drying region of the cleaning chamber.

The present disclosure provides various embodiments of automated in-situ cleaning of a wafer utilizing the Marangoni effect. Instead of a wholesale repeat of wafer cleaning using a wet clean tool should a wafer have undesirable particle contamination, an automated in situ process of remediating for particle contamination at the cleaning chamber may be performed in various embodiments. Also, inspection of the efficacy of the cleaning chamber may be assessed while the wafer is still within the cleaning chamber, rather than after the wafer is removed from the cleaning chamber or after the wafer is further processed.

The cleaning chamber may be inspected utilizing sensors that sample the gas within the cleaning chamber. The gas may be sampled to determine a parameter value from the gas. The parameter value may reflect a concentration (e.g., a percentage value or a parts per million (PPM) value) of, for example, sulfur dioxide ($SO_2$), ammonia ($NH_3$), acetone (($CH_3$)$_2$CO), amines, acids, and/or volatile organic compounds (VOC). A VOC may be an organic compound having an initial boiling point less than or equal to about 250° C. measured at an atmospheric pressure of about 101.3 kPa. An acid may include any ionic compound containing hydrogen ions ($H^+$). An amine may be compounds or functional groups that contain a basic nitrogen atom with a lone pair. The parameter value may also reflect other parameters, such as a humidity or a temperature of the gas.

The sensors may be any type of sensor from which a parameter value may be determined from the gas. For example, the sensor may be a time of flight mass spectrometry sensor (TOFMS), an ion mobility spectrometry sensor (IMS), an airborne molecular contamination (AMC) sensor, a solvent sensor configured to detect a particular solvent, a sensor for detection of acetone, a humidity sensor and/or an ion sensor. Each of these sensors may be conventional and commercially available so are not discussed in detail herein. These sensors may be utilized to detect one or multiple parameter values. For example, a TOFMS may be utilized to detect a VOC parameter value, and an IMS may be utilized to detect an amine, acid, or $SO_2$ parameter value.

In various embodiments, the sensors collect the parameter values over time with each iterative operation of Marangoni wafer cleaning within the cleaning chamber. Accordingly, by analyzing the aggregated data from various iterations of Marangoni wafer cleaning within the cleaning chamber, a relationship between an undesirable amount of contamination and parameter value may be determined based on detection of an outlier from the aggregated data. In certain embodiments, these outliers may determine threshold values, which when passed, may define when remediation may be performed. Also, passage of a particular threshold values may indicate the type of remediation to be performed. These outliers may be determined in accordance with conventional statistical analysis for outliers. For example, these outliers may define threshold values that indicate that a wafer has not been sufficiently cleaned or that there is a malfunction in the cleaning chamber.

Accordingly, remediation may be performed at the cleaning chamber based on the parameter value. In certain embodiments, remediation is performed in response to a determination that the parameter value exceeds a threshold. In certain embodiments, exceeding a threshold may refer to passing a threshold when compared against corresponding historical parameter values and may not necessarily be greater or less than a threshold value. In other embodiments, exceeding a threshold may specifically refer to being greater than a threshold value. The threshold value may be arbitrary, or may reflect a calculated or determined outlier as discussed above. An example of an arbitrary threshold value for a concentration may be a value between about 0.01-0.5 parts per million (ppm) of one or a combination of $SO_2$, $NH_3$, ($CH_3$)$_2$CO, amine, an acid, and/or a VOC.

Remediation may be any type of automated additional process to improve Marangoni wafer cleaning within the cleaning chamber. For example, remediation may improve the level of contamination on a wafer and/or within a gas of a drying region, in situ. In certain embodiments, remediation may include re-immersing a wafer within a bath and repeating the Marangoni wafer cleaning process entirely. In further embodiments, the remediation may include changing a humidity level or a temperature within the cleaning chamber. For example, the humidity may be decreased and/or the temperature may be increased within the cleaning chamber at the gas of the drying region. In further embodiments, the remediation may include removing the solvent and the gas from the cleaning chamber, and reintroducing the solvent and the gas into the cleaning chamber. In further embodiments, the remediation may include removing the gas from the cleaning chamber while leaving the solvent within the cleaning chamber, and reintroducing the gas into the cleaning chamber. In further embodiments, the remediation may include removing the gas from the cleaning chamber while leaving the solvent within the cleaning chamber, and introducing a secondary gas into the cleaning chamber that is different than the gas originally in the drying region. The original gas may be nitrogen ($N_2$) and the secondary gas may be clean filtered ambient air or may be another pure gas or a particular gaseous mixture. In further embodiments, the remediation may include increasing a concentration of the gas in the drying region and/or changing the composition of the gas in the drying region by introducing a secondary gas into the drying region. In further embodiments, the remediation may include removing the original liquid from the cleaning chamber, and introducing a secondary liquid into the cleaning chamber that is different than the liquid originally in the cleaning chamber. The original liquid may be deionized water (DIW) and the secondary liquid may be high density water (HDW).

This remediation may be performed for only one time (e.g., performed once/initially after a threshold value has been exceeded) or may be performed iteratively multiple times until the parameter value no longer exceeds the threshold level or value. Stated another way, being performed iteratively multiple time may include being performed initially and then subsequently escalated should the parameter value still continue to exceed the threshold value after a period of time. The period of time may be set (e.g., constant) or variable among different iterations of the remediation process or of the overall Marangoni wafer cleaning process. For example, the period of time may increase or decrease with each iteration. The escalation may include further increasing a temperature or concentration of a gas beyond an increase performed initially.

After remediation has been satisfactorily performed, the wafer may be transported from the cleaning chamber. In certain embodiments, a conventional final assessment of contamination (e.g., particle deposition on a wafer) may be performed after the wafer is removed from the cleaning chamber to see whether the entire process of wet bench based wafer cleaning using a wet cleaning tool, including the Marangoni wafer cleaning within the cleaning chamber, should be repeated.

FIG. 1 is a block diagram of a cleaning chamber 102, in accordance with some embodiments. The cleaning chamber 102 may include a wafer holder 104 (e.g., a rack) configured to secure a wafer 106 within the cleaning chamber 102. The cleaning chamber 102 may include a bath region 108 and a drying region 110. The bath region 108 may include a bath of a liquid 112. The liquid may be, for example, deionized water and may be referred to also as the bath itself. The drying region 110 may be disposed above the bath region and be configured to enclose a gas. The gas may be, for example, nitrogen gas. Between the gas of the drying region 110 and the bath of the bath region 108, a layer of solvent 114 may be disposed on the liquid 112. The solvent may be, for example, isopropyl alcohol (IPA).

In operation, the wafer holder 104 may move the wafer 106 between the drying region 110 and the bath region 108. Accordingly, the wafer may be moved from being immersed in the liquid 112 to being surrounded by the gas of the drying region 110 by passing through the solvent 114. As discussed above, during Marangoni drying within the cleaning chamber 102, the solvent 114 may be miscible with the liquid 112 and may be absorbed along the surface of the liquid 112 such that the concentration of the absorbed solvent 114 is higher at the tip of the meniscus. The higher concentration of absorbed solvent 114 causes surface tension to be lower at the tip of the meniscus than in the bulk of the liquid 112. This causes the liquid 112 to flow from the drying meniscus toward rest of the liquid 112 (e.g., back into the bath region 108). Such a flow may achieve wafer drying without leaving streaks, spotting, or bath residue on the wafer. After application of the Marangoni flow, the wafer may be further dried through the application of a drying gas (e.g., $N_2$ or filtered ambient air) to the wafer within the drying region of the cleaning chamber.

In certain embodiments, at least one sensor 116 may be disposed within the drying region 110 of the cleaning chamber 102. However, in alternate embodiments, the at least one sensor 116 may be disposed in a collector 118 and not directly within the drying region 110 of the cleaning chamber 102. In yet further embodiments, sensors 116 of the cleaning chamber 102 may be disposed both in the drying region 110 and in the collector 118. The collector 118 may be interfaced with the drying region 110 via a collector interface 118A which controls whether the collector is collecting a gas of the drying region 110 or not. For example, the collector interface 118A may include a valve, which may be opened to allow the collector to collect a gas of the drying region 110 and closed otherwise.

The at least one sensor 116 may be any type of sensor 116 from which a parameter value may be determined from the gas. For example, the sensor 116 may be a time of flight mass spectrometry sensor (TOFMS), an ion mobility spectrometry sensor (IMS), an airborne molecular contamination (AMC) sensor, a solvent sensor configured to detect a particular solvent, a sensor for detection of acetone, a humidity sensor and/or an ion sensor. Each of these sensors may be conventional and commercially available so are not discussed in detail herein. These sensors may be utilized to detect only one or multiple parameter values. For example, a TOFMS may be utilized to detect a VOC parameter value, and an IMS may be utilized to detect an amine, acid, or $SO_2$ parameter value.

The drying region 110 may interface through a drying region output interface 110A with a drying region drain 110B. The drying region output interface 110A may also include a pump for which the gas within the drying region 110 may be pumped into the drying region drain 110B so that the gas may be exhumed from the drying region, as will be discussed further below.

The drying region 110 may also interface through various drying region input interfaces, which provide the drying region with the various gases or solvents that may be present in the drying region 110 or introduced to the cleaning chamber 102 via the drying region 110. Specifically, the drying region 110 may interface though a nitrogen gas input interface 120A with a nitrogen gas source 120B from where nitrogen gas may be inputted into the drying region 110. The nitrogen gas input interface 120A may also include a pump for which the nitrogen gas of the nitrogen gas source 120B may be pumped into the drying region 110. Also, the drying region 110 may interface though a solvent input interface 122A with a solvent source 122B (e.g., IPA source) from where a solvent may be inputted into the drying region 110. The solvent input interface 122A may also include a pump for which the solvent of the solvent source 122B may be pumped into the drying region 110. Furthermore, the drying region 110 may interface though a secondary gas interface 124A with a secondary gas source 124B from where a secondary gas may be inputted into the drying region 110. The secondary gas interface 124A may also include a pump for which the secondary gas of the secondary gas source 124B may be pumped into the drying region 110. Furthermore, the secondary gas source 124B may represent any number of secondary gases and not just a single secondary gas. For example, the secondary gas source 124B may include one of a filtered ambient air source and a gas mixture of nitrogen and oxygen or may represent separate filtered ambient air sources and a gas mixture of nitrogen and oxygen. Each secondary gas source 124B may share the secondary gas interface 124A to connect with the drying region 110 or may have respective secondary gas interfaces 124A to connect with the drying region.

The liquid 112 of the bath region 108 may interface through a bath region output interface 108B with a bath region drain 108C. The bath region output interface 108B may also include a pump for which the liquid 112 within the bath region 108 may be pumped into the bath region drain 108C so that the liquid 112 may be exhumed from the bath region. The bath region 108 may interface though a liquid interface 126A with a liquid source 126B from where a liquid may be inputted into the bath region 108. In certain embodiments, the liquid may include deionized water (DIW), high density water (HDW), or capacitively deionized water (CDIW). The liquid interface 126A may also include a pump for which the liquid source 126B may be pumped into the bath region 108. In certain embodiments, the liquid 112 of the bath region 108 may interface though a secondary liquid interface 128A with a secondary liquid source 128B from where a secondary liquid may be inputted into the bath region 108. In certain embodiments, the secondary liquid at the secondary liquid source 128B may include a different type of liquid than at the liquid source 126B. For example, if the liquid source 126B includes DIW, the secondary liquid source 128B may include HDW. The secondary liquid interface 128A may also include a pump for which the secondary liquid source 128B may be pumped into the bath region 108. Furthermore, the secondary liquid source 128B may represent any number of different secondary liquids and not just a single secondary liquid in certain embodiments. Each respective secondary liquid may share the secondary liquid interface 128A or may have a respective secondary liquid interface 128A.

The solvent 114 may also interface through a solvent output interface 114A with a solvent drain 114B. The solvent output interface 114A may also include a pump for which the solvent 114 may be pumped into the solvent drain 114B so that the solvent 114 may be exhumed from the bath region 108 and the drying region 110. In certain embodiments, the solvent output interface 114A may include an intake portal that interfaces near or adjacent to a water line for the liquid 112, such as just below or at a predetermined water line for the liquid 112 when the solvent is added.

Figure 2A:
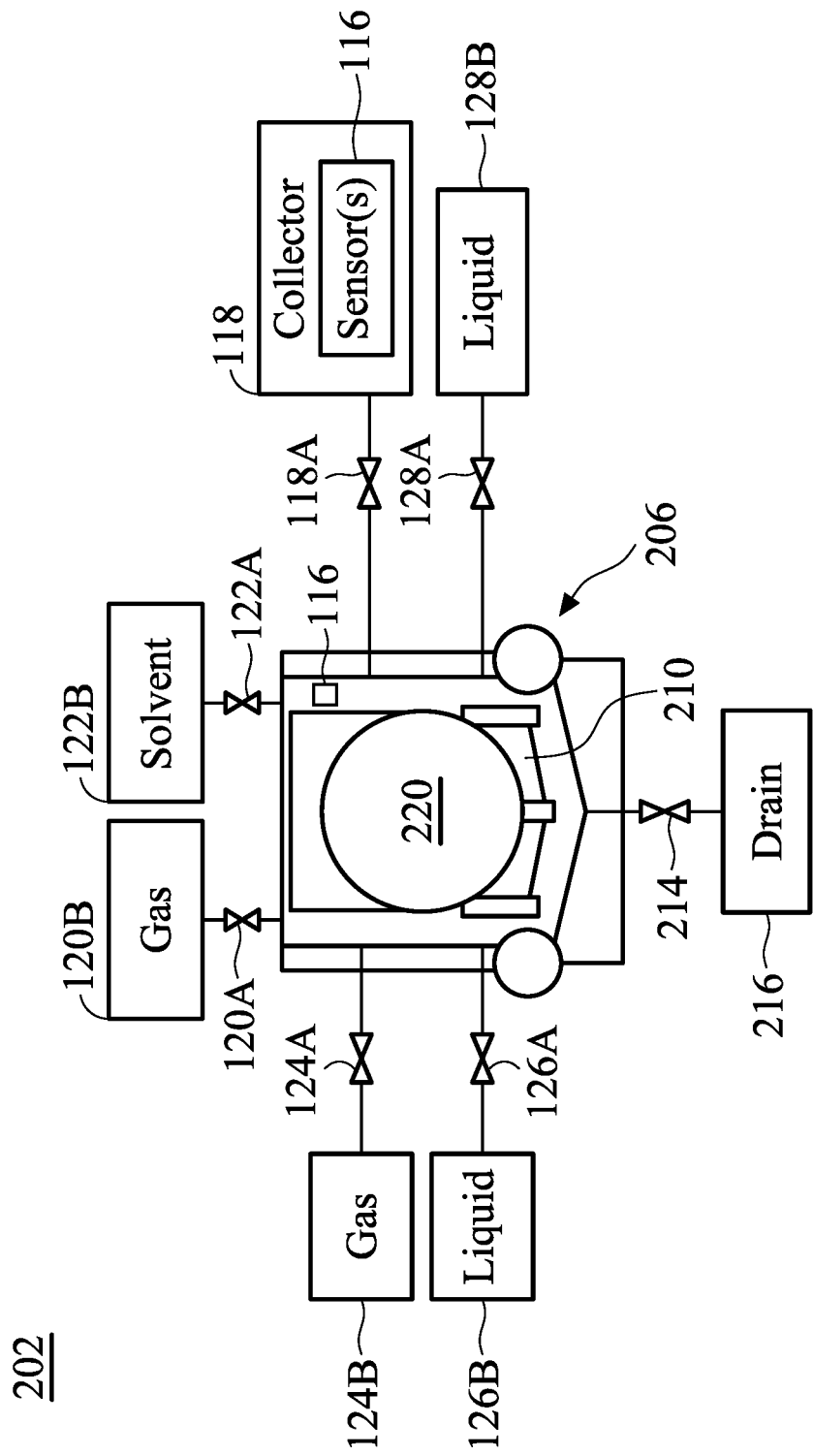
FIG. 2A is a block diagram of a draining Marangoni cleaning system, in accordance with some embodiments.

FIG. 2A is a block diagram of a cleaning chamber 202 with a combined bath region and drying region 206, in accordance with some embodiments. The cleaning chamber 202 of FIG. 2A may also be referred to as a draining Marangoni cleaning system. The combined bath region and drying region 206 may function similar to the bath region and the drying region discussed above, but be implemented in a functional manner within a same region. For example, the combined bath region and drying region 206 may be entirely a drying region without liquid and entirely a bath region when fully filled with liquid. Accordingly, the wafer holder 210 may not need to move vertically, in contrast with the wafer holder discussed in connection with FIG. 1. Also, the combined bath region and drying region 206 may interface through a combined output interface 214 with a combined drain 216. The combined output interface 212 may also include a pump for which a liquid or gas within the combined bath region and drying region 206 may be pumped into the combined drain 216 so that the gas and/or liquid may be exhumed from the combined bath region and drying region 206.

Figure 2B:
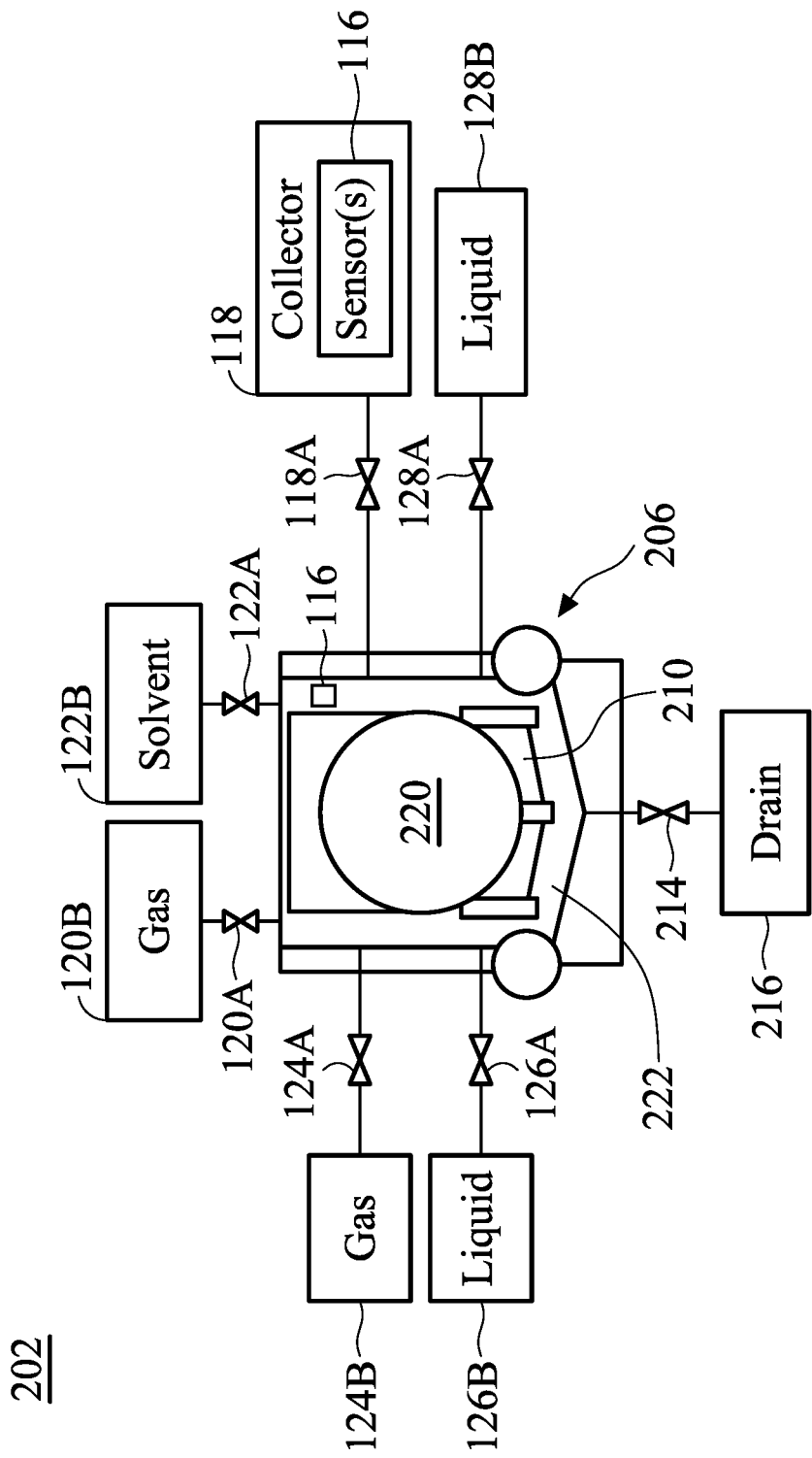
FIG. 2B is a block diagram of a cleaning chamber with a combined bath region and drying region filled with a gas, in accordance with some embodiments.
Figure 2C:
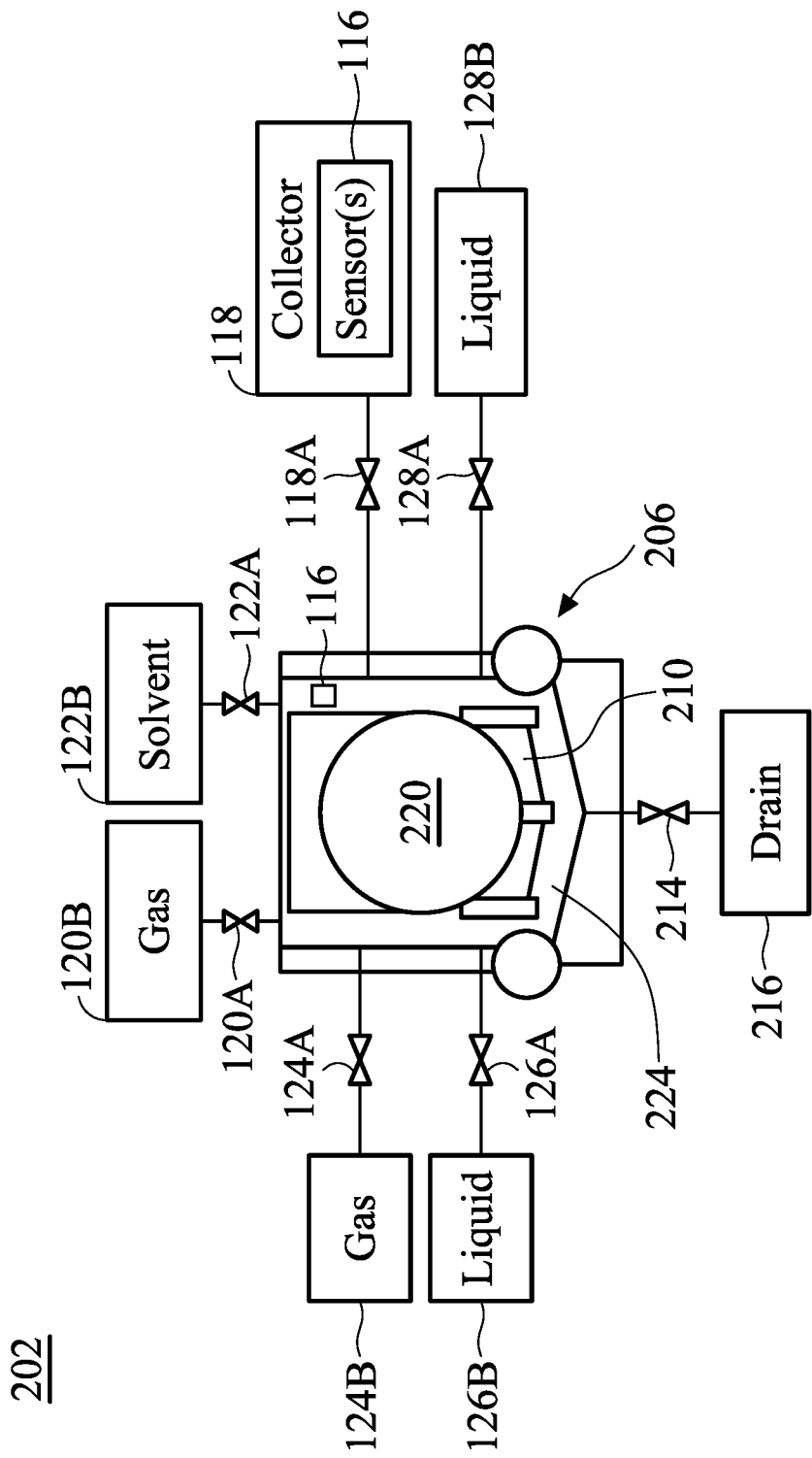
FIG. 2C is a block diagram of a cleaning chamber with a combined bath region and drying region filled with a liquid, in accordance with some embodiments.

In operation, instead of having the wafer holder 210 move the wafer 220 between a liquid bath and a drying gas in a respective bath region and drying region, the liquid bath is drained from the combined bath region and drying region 206 and replaced with a gas. Also, the solvent may be added to the combined bath region and drying region 206 as the liquid is drained. The remaining aspects of the cleaning chamber 202 are discussed further above with similar numerals and will not be repeated further herein for brevity. For the purposes of illustration, FIG. 2B is a block diagram of the cleaning chamber 202 with a combined bath region and drying region 206 filled with a gas 222, in accordance with some embodiments. Also, FIG. 2C is a block diagram of the cleaning chamber 202 with a combined bath region and drying region 206 filled with a liquid 224, in accordance with some embodiments.

Figure 3:
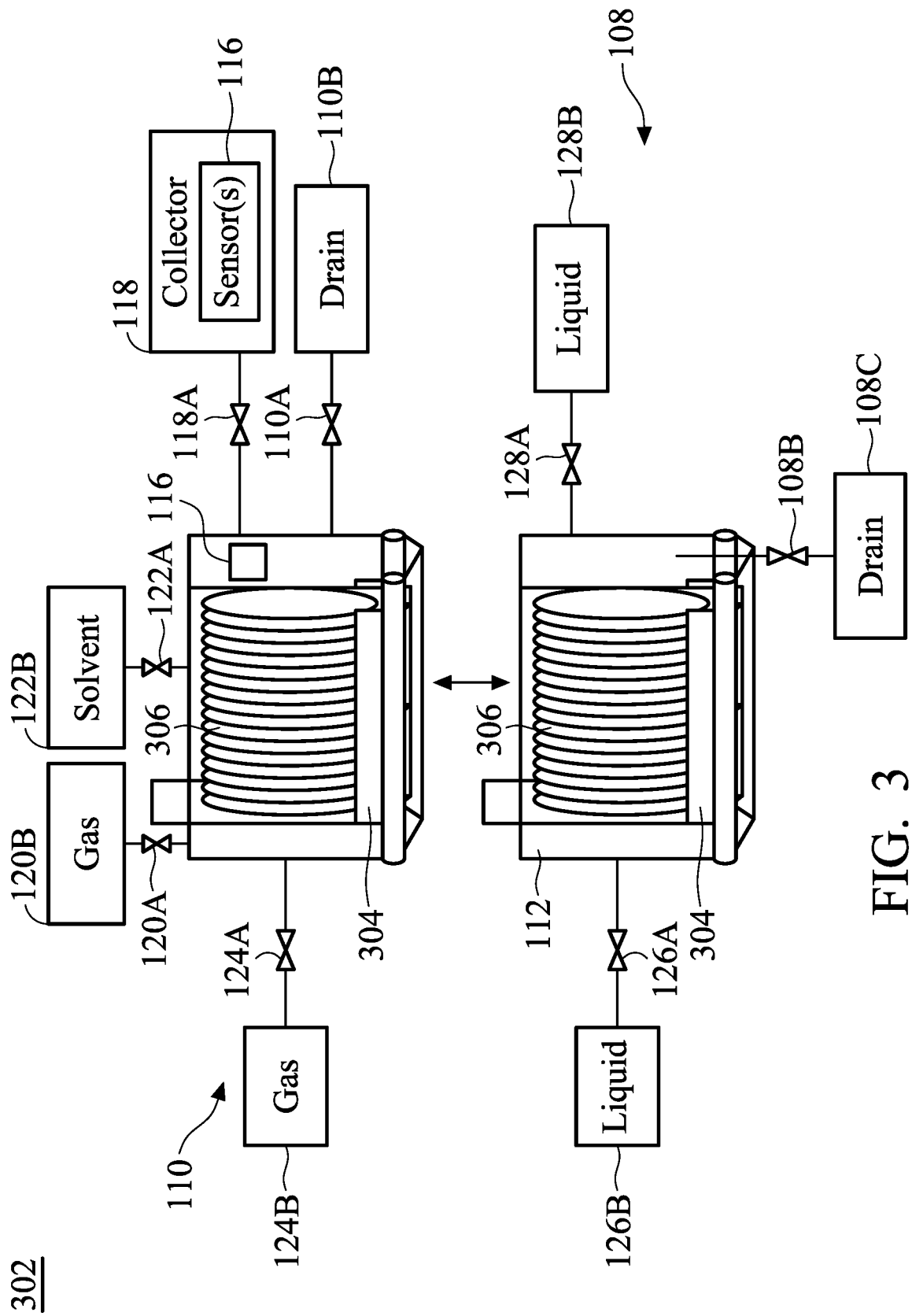
FIG. 3 is a block diagram of a batch Marangoni cleaning system, in accordance with some embodiments

FIG. 3 is a block diagram of a cleaning chamber 302 with a wafer holder 304 that supports a batch of multiple wafers 306, in accordance with some embodiments. The cleaning chamber 302 of FIG. 3 may also be referred to as a batch Marangoni cleaning system. The wafer holder may be configured to support, for example, 18 wafers for simultaneous processing. However, other numbers of wafers may be supported by a single wafer holder 304 in other embodiments. The remaining aspects and components of the cleaning chamber 302 were discussed in detail with respect to FIGS. 1 and 2 and, therefore, such discussion is not repeated here. Also, although the solvent, solvent output interface and solvent drain are not explicitly illustrated in FIG. 3, they may still be part of the cleaning chamber 302 and perform the same functions as the solvent, solvent output interface and solvent drain discussed above.

Figure 4:
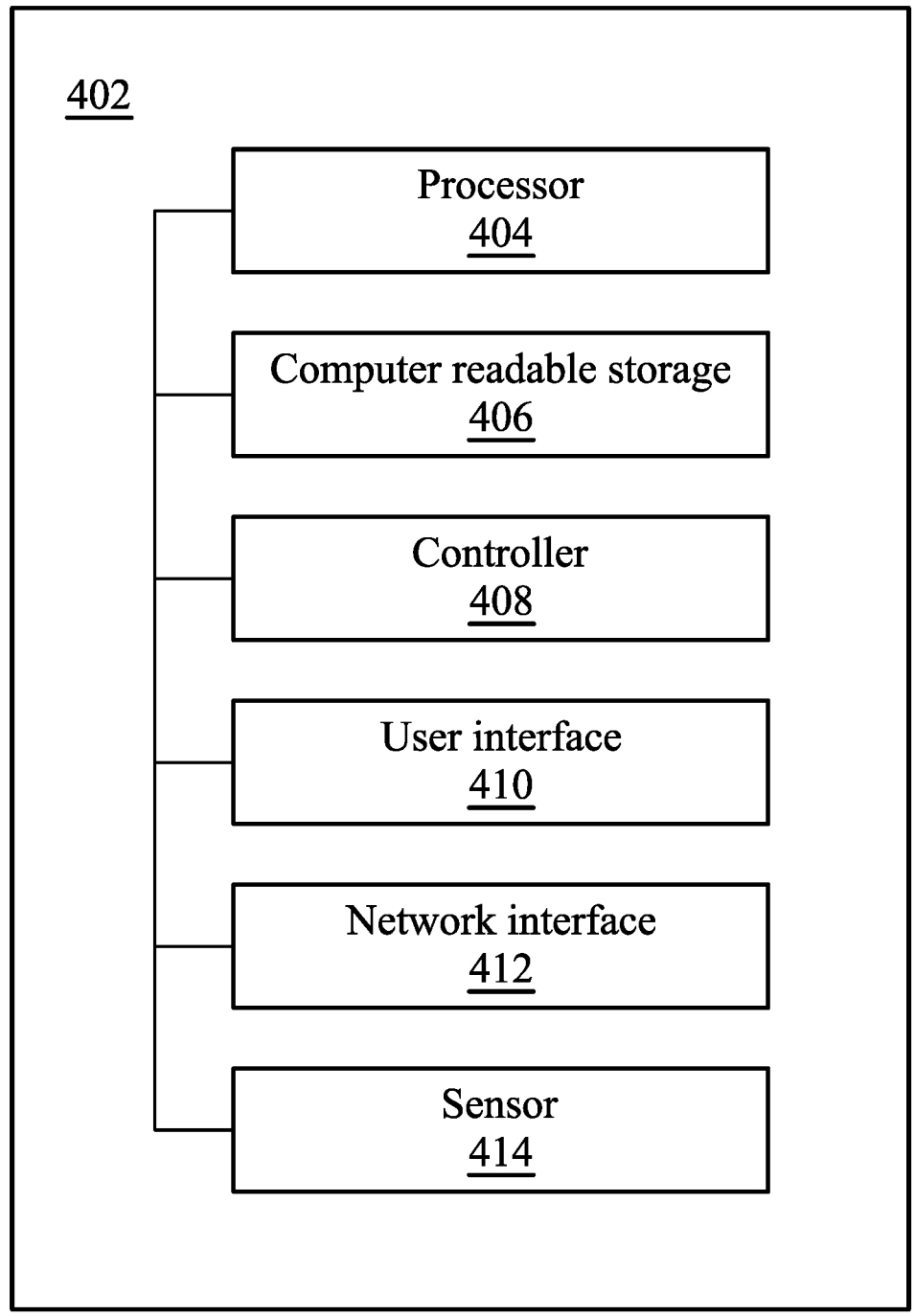
FIG. 4 is a block diagram of various functional modules of a Marangoni cleaning system, in accordance with some embodiment.

FIG. 4 is a block diagram of various functional modules of a cleaning chamber system 402, in accordance with some embodiments. The cleaning chamber system 402 may also include various additional components (e.g., a bath region, a drying region, sensors, drains, interfaces, gas or liquid sources, and the like) that are shown and discussed above with respect to FIGS. 1-3 as part of the cleaning chamber 402 but not illustrated in FIG. 4. The cleaning chamber system 402 may include a processor 404. In further embodiments, the processor 404 may be implemented as one or more processors.

The processor 404 may be operatively connected to a computer readable storage module 406 (e.g., a memory and/or data store), a controller module 408 (e.g., a controller), a user interface module 410 (e.g., a user interface), a network connection module 412 (e.g., network interface), and a sensor 414. In some embodiments, the computer readable storage module 406 may include cleaning chamber logic that may configure the processor 404 to perform various processes discussed herein. The computer readable storage may also store data, such as sensor data collected by a sensor, identifiers for a wafer or a wafer batch, identifiers for a drying tank, identifiers for particular remediation, identifiers for a wet bench cleaning process, relationships between types of remediations and threshold values, threshold values, historical parameter values, and any other parameter value or information that may be utilized to perform the various processes discussed herein.

The cleaning chamber system 402 may include a controller module 408. The controller module 408 may be configured to control various physical apparatuses that control movement or functionality for a wafer holder, an interface (e.g., a pump or a valve), a drain (e.g., a gas drain for gas or a liquid drain for liquid), or a source (e.g., a gas source for gas or a liquid source for liquid). For example, the controller module 408 may control a motor or actuator that may move or activate at least one of a wafer holder, a pump, a valve, and/or a heater. The controller may be controlled by the processor and may carry out aspects of the various processes discussed herein.

The cleaning chamber system 402 may also include the user interface module 410. The user interface module may include any type of interface for input and/or output to an operator of the cleaning chamber system 402, including, but not limited to, a monitor, a laptop computer, a tablet, or a mobile device, etc.

The network connection module 412 may facilitate a network connection of the cleaning chamber system 402 with various devices and/or components of the cleaning chamber system 402 that may communicate (e.g., send signals, messages, instructions, or data) within or external to the cleaning chamber system 402. In certain embodiments, the network connection module 412 may facilitate a physical connection, such as a line or a bus. In other embodiments, the network connection module 412 may facilitate a wireless connection, such as over a wireless local area network (WLAN) by using a transmitter, receiver, and/or transceiver. For example, the network connection module 412 may facilitate a wireless or wired connection with the sensor 414, the processor 404, the computer readable storage 406, and the controller 408.

The sensor 414 may be a sensor that may provide readings or a measurement for a parameter value. Stated another way, the sensor 414 may be any type of sensor from which a parameter value may be determined from the gas of a drying region. For example, the sensor may be a time of flight mass spectrometry sensor (TOFMS), an ion mobility spectrometry sensor (IMS), an airborne molecular contamination (AMC) sensor, a solvent sensor configured to detect a particular solvent, a sensor for detection of acetone, a humidity sensor and/or an ion sensor. Each of these sensors may be conventional and commercially available so are not discussed in detail herein. These sensors may be utilized to detect one or multiple parameter values. For example, a TOFMS may be utilized to detect a VOC parameter value, and an IMS may be utilized to detect an amine, acid, or $SO_2$ parameter value.

Figure 5:
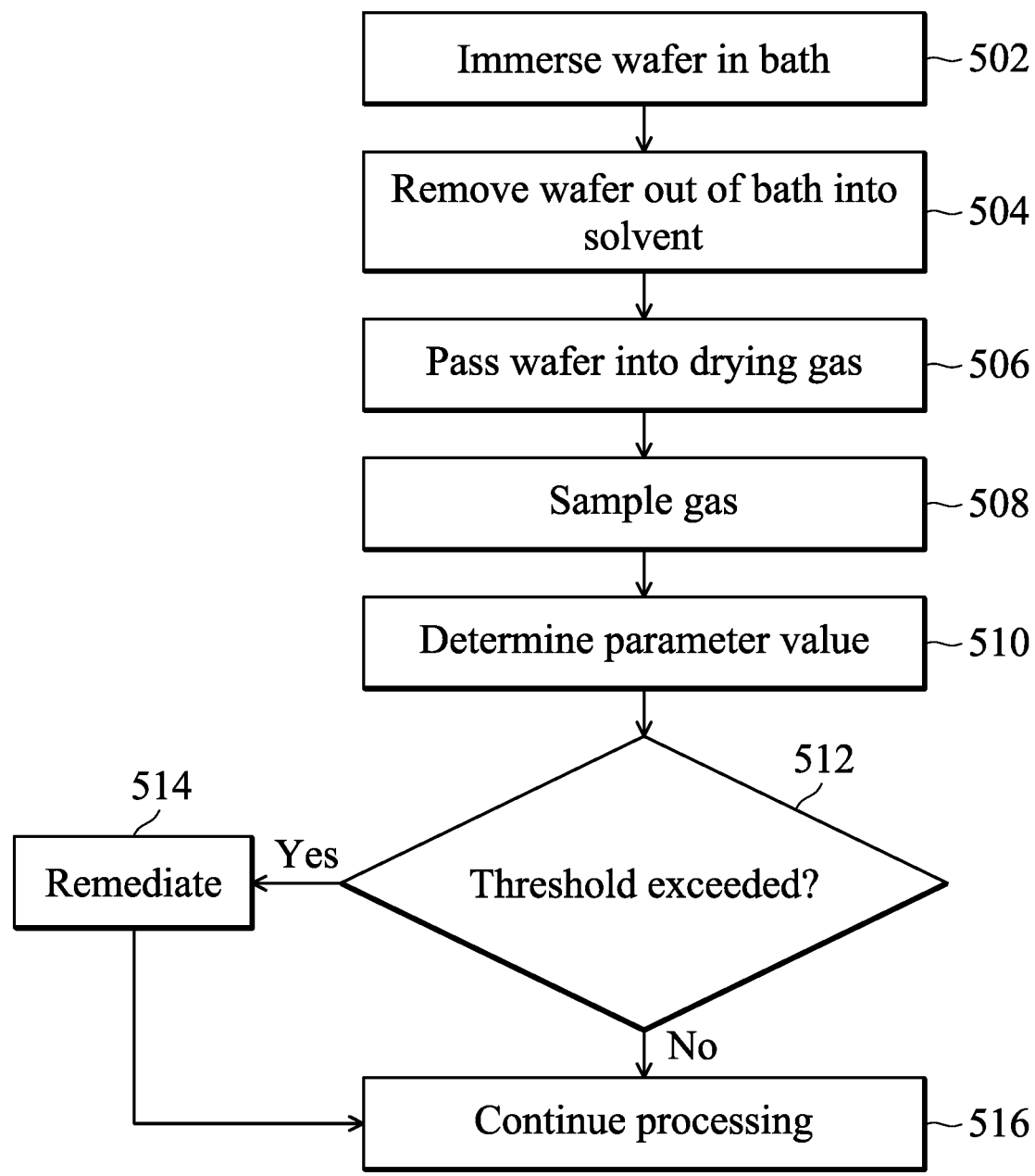
FIG. 5 is a flow chart of a Marangoni cleaning process, in accordance with some embodiments.

FIG. 5 is a flow chart of a Marangoni wafer cleaning process 500, in accordance with some embodiments. The Marangoni wafer cleaning process may be performed using the cleaning chamber, introduced above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a wafer may be immersed within a liquid of a bath region within a cleaning chamber. As discussed above, the bath region may include a liquid such as deionized water to clean the wafer. The wafer may be immersed by being moved into the liquid or may be immersed by placing the wafer into the bath region and filling the bath region with the liquid.

At operation 504, the wafer may be removed out of the liquid of the bath region and through a solvent. As discussed above, the solvent may be IPA in certain embodiments. The solvent may be added to the drying region before or as the wafer is removed from the liquid of the bath region. The solvent may be miscible with the liquid in the bath region and become part of a liquid meniscus which forms as the wafer is lifted from the bath or as the liquid is drained from the wafer. The solvent may be absorbed along the surface of the liquid such that the concentration of the solvent is higher at the tip of the meniscus. The higher concentration of absorbed solvent causes surface tension to be lower at the tip of the meniscus than in the bulk of the liquid in the bath region. This causes the liquid in the bath region to flow from the drying meniscus toward the rest of the liquid. Such a flow may be employed to achieve wafer drying without leaving streaks, spotting, or bath residue on the wafer.

At operation 506, the wafer may be passed into the gas (e.g., a drying gas) within a drying region of the cleaning chamber after passing through the solvent. In various embodiments, the drying gas may be $N_2$, filtered ambient air, or any other type of pure gas or gaseous mixture that may be utilized to dry a cleaned wafer. The drying gas may be pumped into the drying region prior to the wafer moving into the drying region or may be pumped into the drying region as the drying region receives the wafer. As there may be multiple types of drying gases, an original drying gas originally within the drying region prior to remediation may be distinguished from secondary drying gases added to the drying region as part of remediation.

At operation 508, the gas within the drying region may be sampled by a sensor. The sensor may be directly disposed in the drying region or may be within a collector that collects the gas for the sensor. The sensor may be any type of sensor from which a parameter value may be determined from the gas. For example, the sensor may be a TOFMS, an IMS, an airborne AMC sensor, a solvent sensor configured to detect a particular solvent, a sensor for detection of acetone, a humidity sensor and/or an ion sensor. Each of these sensors may be conventional and commercially available so will not be discussed in detail herein. These sensors may be utilized to detect one or multiple parameter values. For example, a TOFMS may be utilized to detect a VOC parameter value, and an IMS may be utilized to detect an amine, acid, or $SO_2$ parameter value.

At operation 510, a parameter value may be determined. The parameter value may be determined from the sampled gas using the sensor. In certain embodiments, the parameter value may reflect a concentration, such as a concentration of $SO_2$, $NH_3$, $(CH_3)_2CO$, an amine, an acid, and/or a VOC. The parameter value may also reflect other parameters, such as a humidity value or a temperature value of the gas.

At operation 512, a determination may be made as to whether the parameter value exceeds a threshold value. The threshold value may be a predetermined value that represents when remediation is to be performed. This remediation may be utilized to correct for a wafer that is not sufficiently cleaned or to correct for a malfunction in the cleaning chamber The threshold value may be arbitrary, or may reflect a calculated or determined outlier. An example of an arbitrary threshold value for a concentration may be a value between about 0.01-0.5 parts per million (ppm) of one or a combination of $SO_2$, $NH_3$, $(CH_3)_2CO$, amine, an acid, and/or a VOC. The outliers may be determined by analyzing the aggregated data from various iterations of Marangoni wafer cleaning within the cleaning chamber. These outliers may represent an undesirable or greater than normal amount of contamination at the wafer or within the cleaning chamber. Accordingly, these outliers may determine threshold values, which when passed, may define when remediation may be performed. For example, these outliers may define threshold values that indicate that a wafer has not been sufficiently cleaned or that there is a malfunction in the cleaning chamber (e.g., a significant deviation from normal). These outliers may be determined in accordance with conventional statistical analysis for outliers.

If the parameter value exceeds a threshold value, the Marangoni wafer cleaning process 500 proceeds to operation 514. If no measured parameter value exceeds a threshold value, the Marangoni wafer cleaning process 500 proceeds to operation 516.

At operation 514, remediation is performed based on threshold value exceeded. In certain embodiments, passage of a particular threshold value may indicate the type of remediation to be performed. However, in other embodiments, only a single type of remediation may be performed based on the parameter value exceeding a single threshold value.

As introduced above, remediation may be any type of automated additional process to improve Marangoni wafer cleaning within the cleaning chamber. For example, remediation may improve the level of contamination on a wafer and/or within a gas of a drying region, in situ. In certain embodiments, remediation may include re-immersing a wafer within a bath and repeating the Marangoni wafer cleaning process. In other embodiments, the remediation may include changing a humidity level or a temperature within the cleaning chamber. For example, the humidity may be decreased and/or the temperature may be increased within the cleaning chamber at the gas of the drying region. In other embodiments, the remediation may include removing the solvent and the gas from the cleaning chamber, and reintroducing the solvent and the gas into the cleaning chamber. In other embodiments, the remediation may include removing the gas from the cleaning chamber while leaving the solvent within the cleaning chamber, and reintroducing the gas into the cleaning chamber. In other embodiments, the remediation may include removing the gas from the cleaning chamber while leaving the solvent within the cleaning chamber, and introducing a secondary gas into the cleaning chamber that is different than the gas originally in the drying region. The original gas may be nitrogen ($N_2$) and the secondary gas may be clean filtered ambient air or may be another pure gas or a particular gaseous mixture. In other embodiments, the remediation may include increasing a concentration of the gas in the drying region and/or changing the composition of the gas in the drying region by introducing a secondary gas into the drying region. In further embodiments, the remediation may include removing the original liquid from the cleaning chamber, and introducing a secondary liquid into the cleaning chamber that is different than the liquid originally in the cleaning chamber. The original liquid may be DIW and the secondary liquid may be HDW.

In particular embodiments, the type of remediation performed may be tied to the particular threshold exceeded. For example, a first type of threshold value may include at least one of a humidity value or a value (e.g., percentage or PPM) of $NH_3$ within the gas of the drying region. Exceeding the first type of threshold value may provoke remediation that is at least one of increasing a temperature within a drying region; increasing a concentration of the gas (e.g., $N_2$) in the drying region; changing the composition of the gas in the drying region by introducing a secondary gas (e.g., clean dry air) into the drying region; and/or replacing the gas in the drying region with a secondary gas (e.g., clean dry air). This type of remediation may improve cleaning of a wafer so that the wafer has less undesirable particle contamination (e.g., via the remediation discussed above).

A second type of threshold value may include a VOC value (e.g., percentage or PPM) within the gas of the drying region. Exceeding this second type of threshold value may provoke remediation that is at least one of: introducing the solvent as a vapor within the drying region; increasing a temperature within the drying region; or adding heated $N_2$ gas into the drying region. This type of remediation may improve cleaning of a wafer so that the wafer has less undesirable particle contamination (e.g., via the remediation discussed above).

A third type of threshold value may include a value (e.g., percentage or PPM) of VOC, acid, NH3, amine, or SO2 within the drying region. Exceeding this third type of threshold value may provoke remediation that is at least one of: replacing the liquid in the bath region with high density water, replacing the solvent with a new solvent, and immersing and retrieving the wafer from the high density water; and/or replacing the gas within the drying region with $N_2$ gas that is heated to a level greater than the gas originally within the drying region. This type of remediation may improve cleaning of a wafer so that the wafer has less undesirable particle contamination (e.g., via the remediation discussed above).

A fourth type of threshold value may include a value (e.g., percentage or PPM) of acid, NH3, amine, or SO2 within the drying region. Exceeding this fourth type of threshold value may provoke remediation that is at least one of: replacing the liquid in the bath region with capacitively deionized water (CDIW), replacing the solvent in the bath region with a new solvent, immersing the wafer in the high density water and retrieving the wafer from the high density water; replacing the gas within the drying region with $N_2$ gas that is heated to a level greater than the gas originally within the drying region; and/or replacing the gas within the drying region with clean dry air (e.g., ambient filtered air). This type of remediation may improve cleaning of a wafer so that the wafer has less undesirable particle contamination (e.g., via the remediation discussed above).

Remediation may be performed for only one time (e.g., performed once/initially after a threshold value has been exceeded) or may be performed iteratively multiple times until the parameter value no longer exceeds the threshold value. Stated another way, being performed iteratively multiple time may include being performed initially and then subsequently escalated should the parameter value still exceed the threshold value after a period of time. The period of time may be set (e.g., constant) or variable among different iterations of the remediation process or of the overall Marangoni wafer cleaning process. For example, the period of time may increase or decrease with each iteration. The escalation may include, for example, further increasing a temperature or concentration of a gas beyond an increase performed initially.

After remediation has been performed, the process 500 may proceed to operation 516. At operation 516, the wafer may be transported from the cleaning chamber. In certain embodiments, the wafer may be transported from the cleaning chamber based on the measured parameter value(s) not exceeding any thresholds (e.g., not exceeding any thresholds within a predetermined time period) or after completing remediation. By not exceeding any thresholds, the wafer may be determined to be satisfactorily clean (e.g., free of particle contaminants). Also, by not exceeding any thresholds, the cleaning chamber may be determined to be free of predeterminable malfunctions.

In an embodiment, a method includes: immersing a wafer in a bath within a cleaning chamber; removing the wafer out of the bath through a solvent and into a gas within the cleaning chamber; determining a parameter value from the gas; and performing remediation within the cleaning chamber in response to determining that the parameter value is beyond a threshold value.

In an embodiment, a method includes: immersing a wafer in a solution within a cleaning chamber; removing the solution out of the cleaning chamber to expose the wafer; applying solvent into the cleaning chamber; applying gas into the cleaning chamber; determining a parameter value from the gas; and performing remediation within the cleaning chamber in response to determining that the parameter value is beyond a threshold value.

In an embodiment, a cleaning chamber includes: a tank region configured to accommodate a tank solution; a drying region configured to accommodate a gas; a solvent drain configured to provide a solvent between the tank region and the drying region to separate the tank solution and the gas; a sensor configured to determine a parameter value within the gas within the drying region;

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the disclosure.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A cleaning system, comprising:
a cleaning chamber;
a liquid bath region within the cleaning chamber, the liquid bath region containing a liquid in which a wafer is immersed;
a solvent layer disposed on a top surface of the liquid;
a gas region within the cleaning chamber, the gas region being disposed above the liquid bath region and containing a gas;
at least one sensor for measuring a parameter value from the gas after the wafer is removed from the liquid bath region through the solvent layer and placed within the gas region; and
at least one processor configured to:
determine that a first parameter value from the gas exceeds a first predetermined threshold value;
determine that a second parameter value from the gas exceeds a second predetermined threshold value, the second predetermined threshold value being a different type than that of the first predetermined threshold value;
perform a first remediation in response to determining that the first parameter value exceeds the first predetermined threshold value; and
perform a second remediation in response to determining that the second parameter value exceeds the second predetermined threshold value, the second remediation being a different type than that of the first remediation,
wherein the first predetermined threshold value comprises a first value representing a threshold amount of $NH_3$ within the gas in the gas region and the first remediation comprises increasing a concentration of $N_2$ in the gas region, and
wherein the second predetermined threshold value comprises a second value representing a threshold amount of a volatile organic compound (VOC) within the gas in the gas region and the second remediation comprises introducing a solvent that forms the solvent layer as a vapor into the gas region.

2. The system of claim 1, wherein the first remediation further comprises increasing a temperature in the gas region.

3. The system of claim 1, wherein the second remediation further comprises increasing a temperature in the gas region.

4. The system of claim 1, wherein the second remediation further comprises adding heated $N_2$ into the gas region.

5. The system of claim 1, wherein the at least one processor is further configured to:
determine that a third parameter value from the gas exceeds a third predetermined threshold value, the third predetermined threshold value being a different type than that of the first and second predetermined threshold values; and perform a third remediation in response to determining that the third parameter value exceeds the third predetermined threshold value, the third remediation comprising:
replacing the liquid in the liquid bath region with high density water.

6. The system of claim 1, wherein the at least one processor is further configured to:
determine that a third parameter value from the gas exceeds a third predetermined threshold value, the third predetermined threshold value being a different type than that of the first and second predetermined threshold values; and
perform a third remediation in response to determining that the third parameter value exceeds the third predetermined threshold value, the third remediation comprising replacing the solvent layer with a new solvent layer.

7. The system of claim 1, wherein the at least one processor is further configured to:
determine that a third parameter value from the gas exceeds a third predetermined threshold value, the third predetermined threshold value being a different type than that of the first and second predetermined threshold values; and
perform a third remediation in response to determining that the third parameter value exceeds the third predetermined threshold value, the third remediation comprising replacing the gas within the gas region with N2 gas that is heated to a level greater than the gas originally within the gas region.

8. A cleaning system, comprising:
a cleaning chamber;
a liquid bath region located within the cleaning chamber, the liquid bath region containing a liquid in which a wafer is immersed;
a solvent layer disposed on a top surface of the liquid, wherein the solvent layer is contained in a solvent region located above the liquid bath region within the cleaning chamber;
a gas region within the cleaning chamber, the gas region being disposed above the liquid bath region and the solvent region and containing a gas;
at least one sensor configured to measure a parameter value from the gas after the wafer is removed from the liquid bath region through the solvent layer and placed within the gas region; and
at least one processor configured to:
determine that a first parameter value from the gas exceeds a first predetermined threshold value;
determine that a second parameter value from the gas exceeds a second predetermined threshold value, the second predetermined threshold value being a different type than that of the first predetermined threshold value;
perform a first remediation in response to determining that the first parameter value exceeds the first predetermined threshold value; and
perform a second remediation in response to determining that the second parameter value exceeds the second predetermined threshold value, the second remediation being a different type than that of the first remediation,
wherein the first predetermined threshold value comprises a first value representing a threshold amount of $NH_3$ within the gas in the gas region and the first remediation comprises increasing a concentration of $N_2$ in the gas region and increasing a temperature in the gas region, and
wherein the second predetermined threshold value comprises a second value representing a threshold amount of a volatile organic compound (VOC) within the gas in the gas region and the second remediation comprises introducing a solvent that forms the solvent layer as a vapor into the gas region and increasing the temperature in the gas region.

9. The system of claim 8, wherein the first remediation further comprises changing the composition of the gas in the gas region by introducing a secondary gas into the gas region.

10. The system of claim 8, wherein the first remediation further comprises replacing the gas in the gas region with a secondary gas.

11. The system of claim 8, wherein the second remediation further comprises adding heated $N_2$ into the gas region.

12. The system of claim 8, wherein the at least one processor is further configured to:
determine that a third parameter value from the gas exceeds a third predetermined threshold value, the third predetermined threshold value being a different type than that of the first and second predetermined threshold values; and
perform a third remediation in response to determining that the third parameter value exceeds the third predetermined threshold value, the third remediation comprising:
replacing the liquid in the liquid bath region with high density water.

13. The system of claim 8, wherein the at least one processor is further configured to:
determine that a third parameter value from the gas exceeds a third predetermined threshold value, the third predetermined threshold value being a different type than that of the first and second predetermined threshold values; and
perform a third remediation in response to determining that the third parameter value exceeds the third predetermined threshold value, the third remediation comprising replacing the gas within the gas region with $N_2$ gas that is heated to a level greater than the gas originally within the gas region.

14. A cleaning system, comprising:
a cleaning chamber;
a liquid bath region within the cleaning chamber, the liquid bath region configured to contain a liquid in which a wafer is immersed;
a solvent layer disposed on a top surface of the liquid;
a gas region within the cleaning chamber, the gas region being disposed above the liquid bath region and configured to hold a gas;
at least one sensor for measuring a parameter value from the gas after the wafer is removed from the liquid bath region through the solvent layer and placed within the gas region; and
at least one processor configured to:
determine that a first parameter value from the gas exceeds a first predetermined threshold value;
determine that a second parameter value from the gas exceeds a second predetermined threshold value, the second predetermined threshold value being a different type than that of the first predetermined threshold value;

determine that a third parameter value from the gas exceeds a third predetermined threshold value, the third predetermined threshold value being a different type than that of the first and second predetermined threshold values;

perform a first remediation in response to determining that the first parameter value exceeds the first predetermined threshold value, wherein the first predetermined threshold value comprises a first value representing a threshold amount of $NH_3$ within the gas in the gas region and the first remediation comprises increasing a concentration of $N_2$ in the gas region;

perform a second remediation in response to determining that the second parameter value exceeds the second predetermined threshold value, the second remediation being a different type than that of the first remediation, wherein the second predetermined threshold value comprises a second value representing a threshold amount of a volatile organic compound (VOC) within the gas in the gas region and the second remediation comprises introducing a solvent that forms the solvent layer as a vapor into the gas region; and perform a third remediation in response to determining that the third parameter value exceeds the third predetermined threshold value, the third remediation being a different type than that of the first and second remediations.

15. The system of claim 14, wherein the first remediation further comprises increasing a temperature in the gas region.

16. The system of claim 14, wherein the second remediation further comprises increasing a temperature in the gas region.

17. The system of claim 14, wherein the second remediation further comprises adding heated $N_2$ into the gas region.

18. The system of claim 14, wherein the third remediation comprises:
   replacing the liquid in the liquid bath region with high density water.

19. The system of claim 14, wherein the third remediation comprises replacing the solvent layer with a new solvent layer.

20. The system of claim 14, wherein the third remediation comprises replacing the gas within the gas region with N2 gas that is heated to a level greater than the gas originally within the gas region.

\* \* \* \* \*